United States Patent
Adam et al.

(10) Patent No.: US 7,172,930 B2
(45) Date of Patent: Feb. 6, 2007

(54) STRAINED SILICON-ON-INSULATOR BY ANODIZATION OF A BURIED P+ SILICON GERMANIUM LAYER

(75) Inventors: Thomas N. Adam, Poughkeepsie, NY (US); Stephen W. Bedell, Wappingers Falls, NY (US); Joel P. de Souza, Putnam Valley, NY (US); Keith E. Fogel, Mohegan Lake, NY (US); Alexander Reznicek, Mount Kisco, NY (US); Devendra K. Sadana, Pleasantville, NY (US); Ghavam Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 285 days.

(21) Appl. No.: 10/883,887

(22) Filed: Jul. 2, 2004

(65) Prior Publication Data

US 2006/0003555 A1  Jan. 5, 2006

(51) Int. Cl.
*H01L 21/00* (2006.01)
*H01L 21/84* (2006.01)
*H01L 21/331* (2006.01)
*H01L 21/8222* (2006.01)
*H01L 21/36* (2006.01)

(52) U.S. Cl. ............... 438/150; 438/311; 438/409; 438/413; 438/479; 438/481; 438/967; 257/E21.562; 257/E21.563; 257/E21.565

(58) Field of Classification Search ............... None
See application file for complete search history.

(56) References Cited

U.S. PATENT DOCUMENTS 5,950,094 A     9/1999  Lin et al.

6,812,116 B2 * 11/2004  Huang et al. ............... 438/464
6,828,214 B2 * 12/2004  Notsu et al. ................ 438/455
6,881,650 B2 *  4/2005  Lee et al. .................... 438/481

(Continued)

FOREIGN PATENT DOCUMENTS

WO   WO2004073043   8/2004

OTHER PUBLICATIONS

Mizuno, T. et al. "High Performance Strained-Si p-MOSFETs on SiGe-on-Insulator Substrates Fabricated by SIMOX Technology." IEDM p. 934-936 (1999).

*Primary Examiner*—David E. Graybill
(74) *Attorney, Agent, or Firm*—Scully, Scott, Murphy & Presser, P.C.; Robert M. Trepp, Esq.

(57) ABSTRACT

A cost efficient and manufacturable method of fabricating strained semiconductor-on-insulator (SSOI) substrates is provided that avoids wafer bonding. The method includes growing various epitaxial semiconductor layers on a substrate, wherein at least one of the semiconductor layers is a doped and relaxed semiconductor layer underneath a strained semiconductor layer; converting the doped and relaxed semiconductor layer into a porous semiconductor via an electrolytic anodization process, and oxidizing to convert the porous semiconductor layer into a buried oxide layer. The method provides a SSOI substrate that includes a relaxed semiconductor layer on a substrate; a high-quality buried oxide layer on the relaxed semiconductor layer; and a strained semiconductor layer on the high-quality buried oxide layer. In accordance with the present invention, the relaxed semiconductor layer and the strained semiconductor layer have identical crystallographic orientations.

30 Claims, 3 Drawing Sheets

U.S. PATENT DOCUMENTS

| | | | |
|---|---|---|---|
| 7,001,826 B2 * | 2/2006 | Akatsu et al. | 438/458 |
| 2002/0146892 A1 * | 10/2002 | Notsu et al. | 438/455 |
| 2003/0003679 A1 | 1/2003 | Doyle et al. | |
| 2003/0119280 A1 * | 6/2003 | Lee et al. | 438/459 |
| 2004/0067622 A1 * | 4/2004 | Akatsu et al. | 438/459 |
| 2004/0115900 A1 * | 6/2004 | Huang et al. | 438/458 |
| 2004/0227187 A1 * | 11/2004 | Cheng et al. | 257/347 |
| 2004/0266137 A1 * | 12/2004 | Huang et al. | 438/458 |
| 2005/0056352 A1 * | 3/2005 | Bedell et al. | 148/537 |
| 2006/0175608 A1 * | 8/2006 | Celler | 257/49 |

* cited by examiner

STRAINED SILICON-ON-INSULATOR BY ANODIZATION OF A BURIED P+ SILICON GERMANIUM LAYER

FIELD OF THE INVENTION

The present invention relates to a semiconductor substrate material and to a method of fabricating the same. More specifically, the present invention relates to a strained semiconductor, e.g., Si-on-insulator (SSOI) substrate material and a robust method of fabricating the same that avoids wafer bonding.

BACKGROUND OF THE INVENTION

In the semiconductor industry, there has been an increasing interest in enhancing performance of complementary metal oxide semiconductor (CMOS) devices by replacing conventional silicon-on-insulator (SOI) substrates with strained semiconductor-on-insulator (SSOI) substrates. The reason behind this interest is that SSOI substrates provide higher carrier (electrons/holes) mobility than a conventional SOI substrate. The strain in the SSOI substrates can either be compressive or tensile.

Conventional methods to fabricate SSOI substrates typically require a layer transfer process wherein a strained Si-containing layer located on a relaxed SiGe layer is transferred onto a handle wafer. In particular, the conventional process includes first creating a relaxed SiGe layer of a few microns in thickness on a surface of a Si-containing substrate. The relaxed SiGe layer typically has an in-plane lattice parameter that is larger than that of Si. Next, a Si-containing layer is grown on the relaxed SiGe layer. Because the SiGe layer has a larger in-plane lattice parameter as compared to Si, the Si-containing layer is under strain.

The structure, including the strained Si-containing layer located on a relaxed SiGe layer, is then bonded to a handle wafer, which includes an insulating layer, such as an oxide layer. The bonding occurs between the strained Si-containing layer and the insulator layer. The Si-containing substrate and the relaxed SiGe layer are then typically removed from the bonded structure to provide a strained Si-on-insulator substrate.

The conventional SSOI substrate preparation method described above is quite expensive and low-yielding because it combines two rather advanced substrate technologies, i.e., high-quality, thick SiGe/strain Si growth, and wafer bonding. Moreover, the conventional preparation method is unattractive for manufacturing a large volume of substrates.

In view of the above, a cost effective and manufacturable solution to fabricate SSOI substrates is required for future high-performance Si-containing CMOS products.

SUMMARY OF THE INVENTION

The present invention provides a cost-effective and manufacturable solution to produce SSOI substrates that avoids wafer bonding which is typically required in conventional technologies to produce SSOI substrate materials. In particular, the method of the present invention, which fabricates SSOI substrates, includes creating a buried porous layer underneath a strained semiconductor layer. The porous layer is then converted into a buried oxide layer by employing a high temperature oxidation/anneal step such that only a part of the strained semiconductor layer is consumed during processing.

The method provides a SSOI substrate that includes a strained semiconductor layer atop an oxide layer, the oxide layer is located on a relaxed semiconductor template. Unlike the conventional process described above, the strained semiconductor layer and the relaxed semiconductor layer have a commensurate, i.e., identical, crystal orientation. Moreover, the oxide layer that is formed by the inventive method is of 'high-quality' meaning that the oxide layer has a leakage of about 1 microAmp or less and a breakdown field of about 2 Megavolts/cm or greater.

In broad terms, the method of the present invention comprises the steps of:

providing a structure that comprises a substrate, a relaxed semiconductor layer on the substrate, a doped and relaxed semiconductor layer on the relaxed semiconductor layer, and a strained semiconductor layer on the doped and relaxed semiconductor layer, said relaxed semiconductor layer, said doped and relaxed semiconductor layer and said strained semiconductor layer have identical crystallographic orientations;

converting the doped and relaxed semiconductor layer underneath the strained semiconductor layer into a buried porous layer; and annealing the structure including the buried porous layer to provide a strained semiconductor-on-insulator substrate, wherein during said annealing the buried porous layer is converted into a buried oxide layer.

In addition to the method described above, the present invention also relates to the SSOI substrate that is formed. Specifically, the SSOI substrate of the instant invention comprises:

a substrate;

a relaxed semiconductor layer on the substrate;

a high-quality buried oxide layer on the relaxed semiconductor layer; and a strained semiconductor layer on the high-quality buried oxide layer, wherein the relaxed semiconductor layer and the strained semiconductor layer have identical crystallographic orientations.

DETAILED DESCRIPTION OF THE INVENTION

Figure 1A:
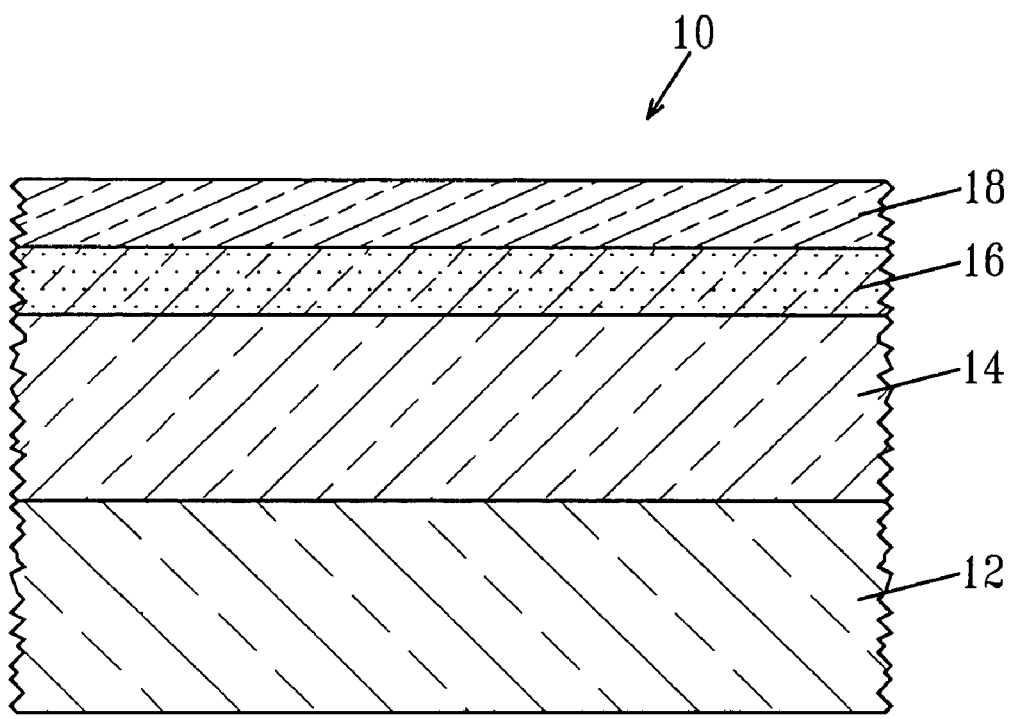
FIGS. 1A–1D are pictorial representations (through cross sectional views) illustrating the basic processing steps employed in fabricating the inventive SSOI substrate. The inventive SSOI substrate shown in FIG. 1D contains a strained semiconductor layer and a buried oxide that are both unpatterned.

The present invention, which provides a method of fabricating a SSOI substrate and the SSOI substrate produced by the method, will now be described in greater detail by referring to the drawings that accompany the present application. The drawings are provided for illustrative purposes only and are thus not drawn to scale. In the drawings, like and corresponding elements are referred to by like reference numerals.

The method of the present invention begins with first providing the structure 10 shown, for example, in FIG. 1A. Structure 10 includes a substrate 12, a relaxed semiconductor, e.g., SiGe alloy, layer 14 located on a surface of substrate 12, a doped and relaxed semiconductor layer 16 located on the relaxed semiconductor layer 14, and a strained semiconductor layer 18 located on a surface of the doped and relaxed semiconductor layer 16. In accordance with the present invention, layers 14, 16 and 18 have the same crystallographic orientation since those layers are each formed by epitaxial growth.

Examples of various epitaxial growth processes that can be employed in the present invention in fabricating layers 14, 16 and 18 on substrate 12 include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE).

The substrate 12 employed in the present invention may be comprised of any material or material layers including, for example, crystalline glass or metal, but preferably the substrate 12 is a crystalline semiconductor substrate. Examples of semiconductor substrates that can be employed as substrate 12 include, but are not limited to: Si, SiGe, SiC, SiGeC, GaAs, InAs, InP, and other III/IV or II/VI compound semiconductors. The term "semiconductor substrate" also includes preformed silicon-on-insulator (SOI) or SiGe-on-insulator (SGOI) substrates which may include any number of buried insulating (continuous, non-continuous or a combination of continuous and non-continuous) regions therein. In one preferred embodiment, the substrate 12 is a Si-containing substrate. The substrate 12 may be undoped or it may be an electron rich or hole-rich substrate, i.e., doped substrates.

The relaxed semiconductor layer 14 is then epitaxially grown on a surface of the substrate 12 using one of the above mentioned processes. In the following description the relaxed semiconductor layer 14 is referred to a relaxed SiGe layer 14 since that semiconductor material represents a preferred material for layer 14. The term "SiGe alloy layer" denotes a SiGe layer that comprises up to 99 atomic percent Ge. More typically, the SiGe alloy layer comprises from about 1 to about 99 atomic percent Ge, with a Ge atomic percent from about 10 to about 50 atomic percent being more highly preferred.

The relaxed SiGe alloy layer 14 may be a single layer having a continuous distribution of Ge, or it may be a graded layer having a varying content of Ge included within different regions of the layer. As stated above, layer 14 is a relaxed layer having a measured degree of relaxation from about 10% or greater. Typically, the surface region of the relaxed semiconductor layer 14 is metastable having a defect (stacking faults, pile-up and threading) density that is typically about 1E5 defects/$cm^3$ or greater.

The relaxed semiconductor layer 14 may be doped or undoped. The type of dopant and concentration of dopant within the layer 14 is arbitrary and can be predetermined by a skilled artisan. When doped, relaxed layer 14 typically has a dopant concentration that is greater than 1E17 atoms/$cm^3$. Doped layer 14 is formed by providing a dopant source with the Si source, or the Ge source, or both sources used during the epitaxial growth process.

The thickness of the relaxed semiconductor layer 14 may vary so long as a relaxed layer can be formed. The thickness of the relaxed semiconductor layer 14 is dependent on the Ge content of the layer. Typically, and for a relaxed semiconductor layer 14 having a Ge content of less than about 50 atomic %, layer 14 has a thickness from about 1 to about 5000 nm, with a thickness from about 1000 to about 3000 nm being more typical.

Although relaxed SiGe alloy templates are preferred, the present invention also contemplates the use of other semiconductor materials that can be formed in relaxed state.

Next, a doped and relaxed semiconductor layer 16 is formed on the relaxed semiconductor layer 14. The doped and relaxed semiconductor layer 16 may include p- or n-type dopants, with p-type dopants being highly preferred. P-type dopants include Ga, Al, B and $BF^2$. The doped and relaxed semiconductor layer 16 may be a separate layer, as shown in FIG. 1A, or it can be an upper portion of the previously formed relaxed semiconductor layer 14. The term "semiconductor" when used in content with layer 16 denotes any semiconductor material including, for example, Si, SiGe, SiC, and SiGeC. Preferably, the doped and relaxed semiconductor layer 16 is a Si-containing semiconductor, with Si and SiGe being most preferred.

In accordance with the present invention, the doped and relaxed semiconductor layer 16 is a layer that is more heavily doped than the surrounding layers, i.e., layers 14 and 18. Typically, the doped and relaxed semiconductor layer 16 contains a p-type dopant concentration of about 1E19 atoms/$cm^3$ or greater, with a p-type dopant concentration from about 1E20 to about 5E20 atoms/$cm^3$ being more typical. The doped and relaxed semiconductor layer 16 is formed using one of the above mentioned epitaxial growth processes in which the dopant source is included with the semiconductor source. The doped and relaxed semiconductor material 16 may have an in-plane lattice parameter that is either larger or smaller than that of virgin Si.

The doped and relaxed semiconductor layer 16 is a thin layer whose thickness will define the thickness of the buried oxide layer to be subsequently formed. Typically, the doped and relaxed semiconductor layer 16 has a thickness from about 1 to about 1000 nm, with a thickness from about 10 to about 200 nm being more typical.

After forming the doped and relaxed semiconductor layer 16, a strained semiconductor layer 18 is formed on top of the doped and relaxed semiconductor layer 16 using one of the above-mentioned epitaxial growth processes. The strained semiconductor layer 18 may be comprised of one of the semiconductor materials mentioned above in connection with layer 16. The strained semiconductor layer 18 and the doped and relaxed semiconductor 16 can thus be comprised of the same or different semiconductor material. The strained semiconductor 18 can have a tensile or compressive stress.

It is noted that the growth of layers 14, 16 and 18 may occur using the same or different epitaxial growth process. Moreover, it is also contemplated to form layers 14, 16 and 18 in the same reactor chamber without breaking vacuum.

The strained semiconductor layer 18 may be doped or undoped. When doped, the strained semiconductor layer 18 typically has a dopant concentration of about 1E15 atoms/$cm^3$ or greater. The thickness of layer 18 is typically from about 5 to about 2000 nm, with a thickness from about 10 to about 500 nm being more typical.

In one embodiment of the present invention, the strained semiconductor layer 18 and the doped and relaxed semiconductor layer 16 are comprised of the same or different Si-containing semiconductor, with Si or SiGe being highly preferred.

In a highly preferred embodiment of the present invention, the strained semiconductor layer 18 and the relaxed semiconductor layer 14 are both doped layers having a dopant concentration of about 1E15 atoms/$cm^3$ or greater, while the doped and relaxed semiconductor layer 16 is a p-doped layer having a dopant concentration of about 1E20 atoms/cm$^3$ or greater.

In accordance with the present invention, layers 14, 16 and 18 have the same crystallographic orientation as substrate 12 since the various layers are formed by epitaxial growth. Hence, layers 14, 16 and 18 can have a (100), (110), (111) or any other crystallographic orientation.

Next, the structure shown in FIG. 1A is subjected to an electrolytic anodization process that is capable of converting the doped and relaxed semiconductor layer 16 into a porous region. The structure, after the electrolytic anodization process has been performed, is shown, for example in FIG. 1B. In the drawing, reference numeral 20 denotes the porous region or layer.

The anodization process is performed by immersing the structure shown in FIG. 1A into an HF-containing solution while an electrical bias is applied to the structure with respect to an electrode also placed in the HF-containing solution. In such a process, the structure typically serves as the positive electrode of the electrochemical cell, while another semiconducting material such as Si, or a metal is employed as the negative electrode.

In general, the HF anodization converts the doped and relaxed semiconductor layer 16 into a porous semiconductor layer 20. The rate of formation and the nature of the porous semiconductor layer 20 so-formed (porosity and microstructure) is determined by both the material properties, i.e., doping type and concentration, as well as the reaction conditions of the anodization process itself (current density, bias, illumination and additives in the HF-containing solution). Generally, the porous semiconductor layer 20 formed in the present invention has a porosity of about 0.1% or higher.

The term "HF-containing solution" includes concentrated HF (49%), a mixture of HF and water, a mixture of HF and a monohydric alcohol such as methanol, ethanol, propanol, etc, or HF mixed with at least one surfactant. The amount of surfactant that is present in the HF solution is typically from about 1 to about 50%, based on 49% HF.

The anodization process, which converts the doped and relaxed semiconductor layer 16 into a porous semiconductor layer 20, is performed using a constant current source that operates at a current density from about 0.05 to about 50 milliAmps/cm$^2$. A light source may be optionally used to illuminate the sample. More preferably, the anodization process of the present invention is employed using a constant current source operating at a current density from about 0.1 to about 5 milliAmps/cm$^2$.

The anodization process is typically performed at room temperature or, a temperature that is elevated from room temperature may be used. Following the anodization process, the structure is typically rinsed with deionized water and dried. Anozidation typically occurs for a time period of less than about 10 minutes, with a time period of less than 1 minute being more typical.

Figure 1B:
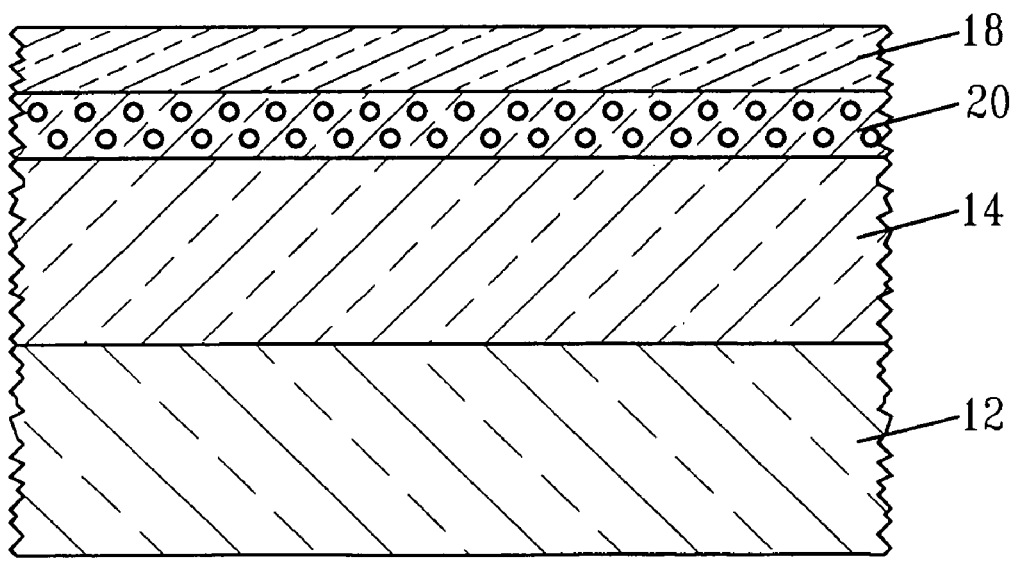
Figure 1C:
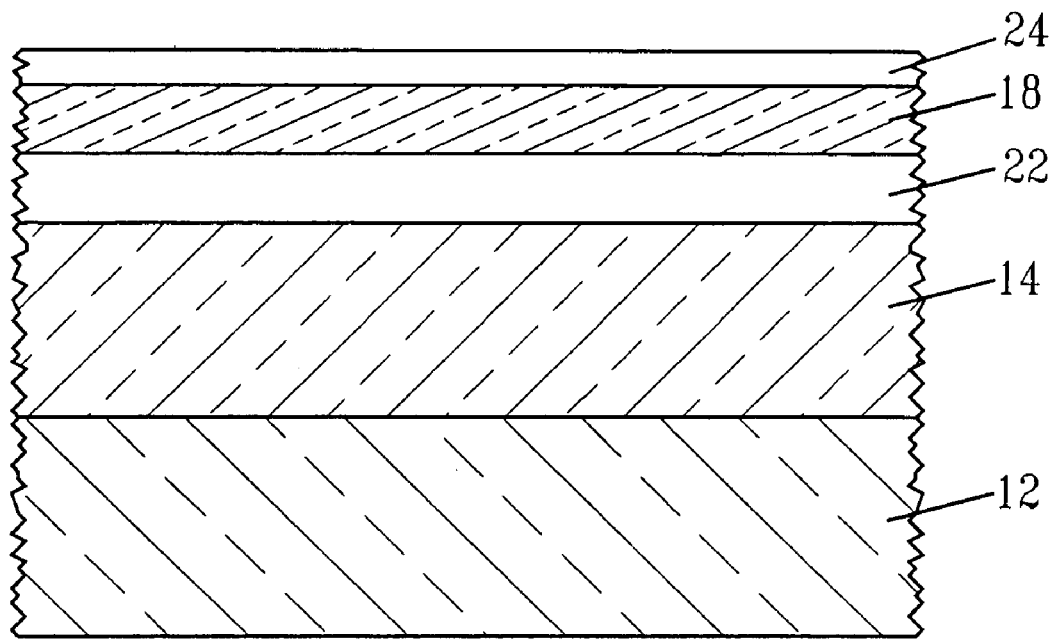

The structure shown in FIG. 1B including the porous semiconductor layer 20 is then heated, i.e., annealed, at a temperature which converts the porous semiconductor layer 20 into a buried oxide region 22. The resultant structure is shown, for example, in FIG. 1C. As shown, the structure includes a strained semiconductor layer 18 atop a buried oxide layer 22. The buried oxide layer 22 is located atop the relaxed semiconductor layer 14, which is, in turn, atop of the substrate 12.

Figure 1D:
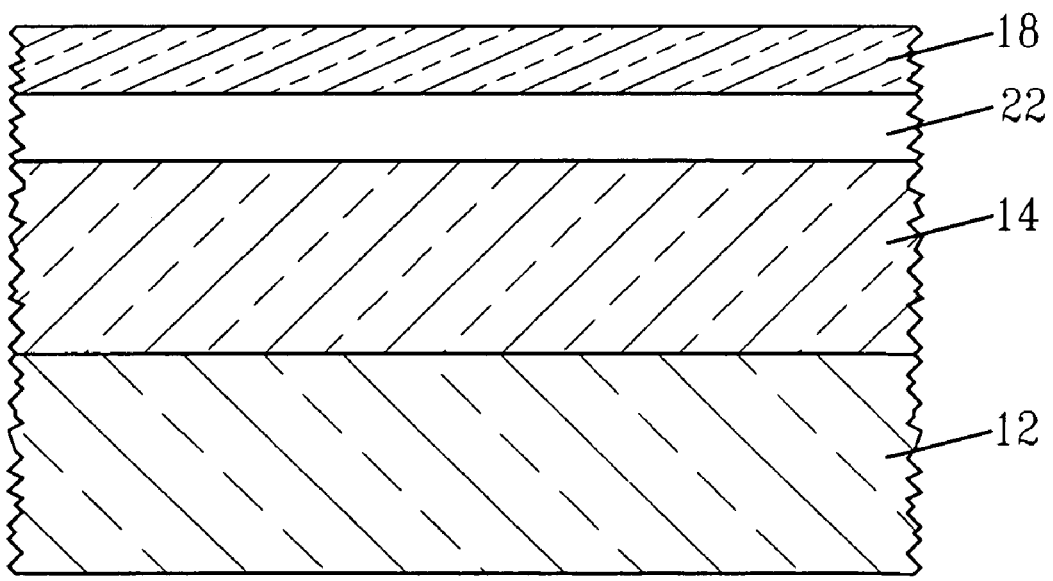

Note that an oxide layer 24 is formed atop layer 18 during the heating step. This surface oxide layer, i.e., oxide layer 24, is typically, but not always, removed from the structure after the heating step using a conventional wet etch process wherein a chemical etchant such as HF that has a high selectivity for removing oxide as compared to semiconductor is employed. The structure, without the surface oxide layer 24, is shown in FIG. 1D.

Note that when the oxide layer 24 is removed, the above processing steps can be repeated any number of times to provide a multilayered structure containing, from bottom to top, substrate/(relaxed semiconductor/buried oxide/strained semiconductor)$_x$ wherein x is greater than 1. When x is 1, the structure shown in FIG. 1D is formed.

In some embodiments of the present invention, multiple buried oxide layers can be obtained by forming continuous layers of materials 14, 16 and 18 on substrate 12 and then performing the electrolytic anodization process and annealing process of the present invention.

The surface oxide layer 24 formed after the heating step of the present invention has a variable thickness which may range from about 10 to about 1000 nm, with a thickness of from about 20 to about 500 nm being more highly preferred. Buried oxide layer 22 typically has the same thickness as previously described for the doped and relaxed semiconductor layer 16.

Specifically, the heating step of the present invention is an annealing step which is performed at a temperature that is greater than 400° C., preferably greater than 1100° C. A typical temperature range for the heating step of the present invention is from about 1200° to about 1320° C.

Moreover, the heating step of the present invention is carried out in an oxidizing ambient which includes at least one oxygen-containing gas such as $O_2$, NO, $N_2O$, ozone, air and other like oxygen-containing gases. The oxygen-containing gas may be admixed with each other (such as an admixture of $O_2$ and NO), or the gas may be diluted with an inert gas such as He, Ar, $N_2$, Xe, Kr, or Ne. When a diluted ambient is employed, the diluted ambient contains from about 0.1 to about 100% of oxygen-containing gas, the remainder, up to 100%, being inert gas.

The heating step may be carried out for a variable period of time that typically ranges from greater than 0 minutes to about 1800 minutes, with a time period from about 60 to about 600 minutes being more highly preferred. The heating step may be carried out at a single targeted temperature, or various ramp and soak cycles using various ramp rates and soak times can be employed.

The heating step is performed under an oxidizing ambient to achieve the presence of oxide layers, i.e., layers 22 and 24. Note that the porous semiconductor region reacts with diffused oxygen at an enhanced rate.

After heating, and subsequent removal of surface oxide layer 24, the structure can be subjected to a thermal process (i.e., baking step) that is capable of reducing the content of dopants present in the final structure. The baking step is typically performed in the presence of a hydrogen-containing ambient such as $H_2$. Leaching of dopants from the structure typically occurs when this step is performed at a temperature that is greater than 800° C., with a temperature of greater than 1000° C. being more typical. This thermal step is optional and does not need to be performed in all instances. Leaching of dopants using the thermal treatment process can be performed for any desired period of time.

Typically, the thermal process, which leaches dopants from the structure, is performed for a time period from about 1 to about 60 minutes. As stated above, this baking step reduces the amount of dopant within the SSOI substrate.

Although it can be used to reduce any dopant within the SSOI substrate, it is particularly employed to remove boron from the structure.

After performing the above processing steps, conventional CMOS process can be carried out to form one or more CMOS devices such as field effect transistors (FETs) atop the strained semiconductor layer. The CMOS processing is well known to those skilled in the art; therefore details concerning that processing are not needed herein.

The method of the present invention described above provides a SSOI substrate including a strained semiconductor layer 18 atop an oxide layer 22, the oxide layer 22 is located atop a relaxed semiconductor layer 14 which is located on a substrate 12. Unlike the conventional process described above, the strained semiconductor layer 18 and the relaxed semiconductor layer 14 have a commensurate, i.e., identical, crystal orientation. Moreover, the oxide layer 22 that is formed by the inventive method is of 'high-quality' meaning that the buried oxide layer 22 has a leakage of about 1 microAmp or less and a breakdown field of about 2 Megavolts or greater.

Figure 2A:
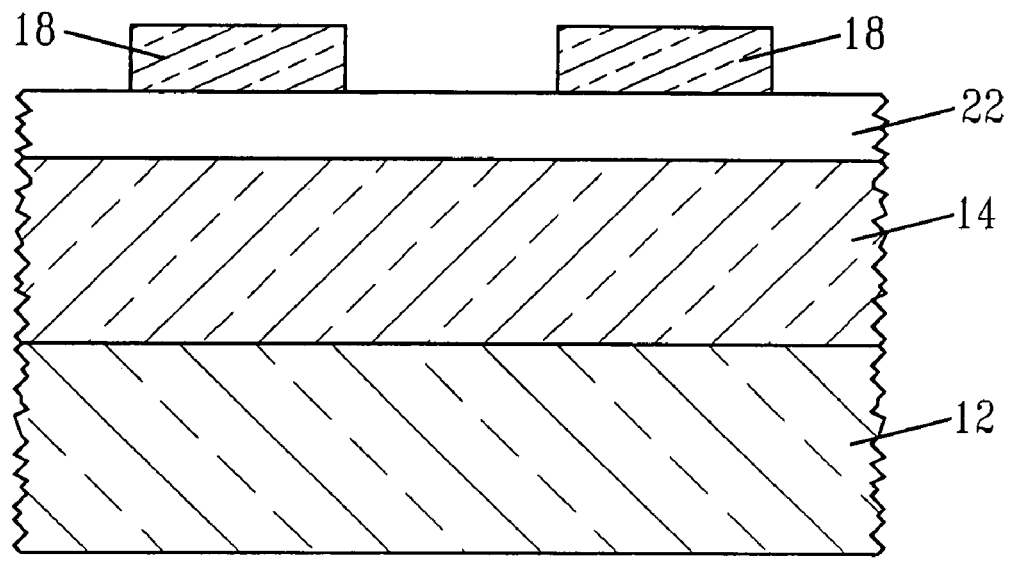
FIGS. 2A–2B are pictorial representations (through cross-sectional views) illustrating patterned SSOI substrates that are fabricated using the method of the present invention.

The embodiment depicted in FIGS. 1A–1D illustrates the case wherein no layers are patterned. In another embodiment, it is also contemplated to form a structure that includes a patterned strained semiconductor layer 18 on a buried oxide layer 22. One such patterned SSOI structure is shown, for example, in FIG. 2A. The patterned structure is formed using the same basic processing steps as described above except that prior to anodization the strained semiconductor layer 18, shown, for example, in FIG. 1A, is patterned by lithography and etching. The lithography step includes applying a photoresist on the strained semiconductor layer 18, exposing the photoresist to a pattern of radiation and developing the patterned into the exposed photoresist by utilizing a conventional resist developer. The etching step can include a wet etch process or a dry etching process that selectively removes the exposed strained semiconductor layer 18. After stripping the patterned photoresist from the structure, anodization and oxidation, as described above, are performed. In some embodiments, the oxide layer 22 not underneath the strained semiconductor layer can be removed exposing the relaxed semiconductor layer 14.

Figure 2B:
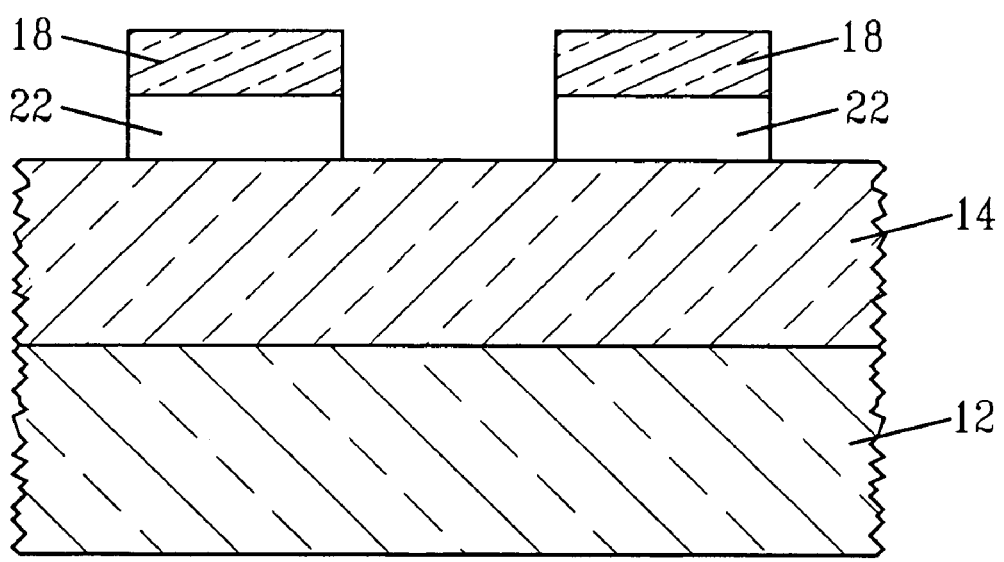

In yet another embodiment of the present invention, a patterned SSOI substrate, such as illustrated in FIG. 2B, can be formed. This patterned SSOI substrate is formed by first conducting the processing steps of epitaxial growth, anodization and oxidation, and then patterning the structure by lithography and etching. The etching step may be stopped atop a surface of oxide layer 22 providing the structure shown in FIG. 2A, or it can be stopped when a surface of the relaxed semiconductor layer 14 is reached, See FIG. 2B. The etch used in removing the exposed portions of both layer 18 and 22 can include a single etch step, or multiple etching steps may be employed.

CMOS processing can also be performed on the patterned SSOI substrates as well.

While the present invention has been particularly shown and described with respect to preferred embodiments thereof, it will be understood by those skilled in the art that the foregoing and other changes in forms and details may be made without departing from the scope and the spirit of the present invention. It is therefore intended that the present invention not be limited to the exact forms and details described and illustrated, but fall within the scope of the appended claims.

What we claim is:

1. A method of fabricating a strained semiconductor-on-insulator (SSOI) substrate comprising the steps of:
    providing a structure that comprises a substrate, a relaxed semiconductor layer on the substrate, a doped and relaxed semiconductor layer on the relaxed semiconductor layer, and a strained semiconductor layer on the doped and relaxed semiconductor layer, said relaxed semiconductor layer, said doped and relaxed semiconductor layer and said strained semiconductor layer have identical crystallographic orientations;
    converting the doped and relaxed semiconductor layer underneath the strained semiconductor layer into a buried porous layer; and
    annealing the structure including the buried porous layer to provide a strained semiconductor-on-insulator substrate, wherein during said annealing the buried porous layer is converted into a buried oxide layer.

2. The method of claim 1 wherein the providing step includes epitaxial growth of said relaxed semiconductor layer, said doped and relaxed semiconductor layer and said strained semiconductor layer.

3. The method of claim 2 wherein said epitaxial growth comprises rapid thermal chemical vapor deposition, low-energy plasma deposition, ultra-high vacuum chemical vapor deposition, atmospheric pressure chemical vapor deposition or molecular beam epitaxy.

4. The method of claim 1 wherein said substrate is a crystalline semiconductor substrate.

5. The method of claim 4 wherein said crystalline semiconductor substrate is doped.

6. The method of claim 4 wherein said crystalline semiconductor substrate is a Si-containing substrate.

7. The method of claim 1 wherein said relaxed semiconductor layer comprises a SiGe alloy layer having up to 99 atomic percent Ge.

8. The method of claim 1 wherein said relaxed semiconductor layer has a measured degree of relaxation of about 10% or greater.

9. The method of claim 1 wherein said relaxed semiconductor layer has a surface region that is metastable and has a defect density of about 1E5 defects/cm$^3$ or greater.

10. The method of claim 1 wherein said relaxed semiconductor layer is a graded SiGe alloy layer having a varying content of Ge.

11. The method of claim 1 wherein said relaxed semiconductor layer is doped.

12. The method of claim 1 wherein the doped and relaxed semiconductor layer comprises a p-type dopant.

13. The method of claim 12 wherein said p-type dopant is present in said doped and relaxed semiconductor layer in a concentration from about 1E19 atoms/cm$^3$ or greater.

14. The method of claim 1 wherein said doped and relaxed semiconductor layer comprises a Si-containing semiconductor.

15. The method of claim 14 wherein said Si-containing semiconductor comprises Si or SiGe.

16. The method of claim 1 wherein said doped and relaxed semiconductor layer is an upper region of said relaxed semiconductor layer.

17. The method of claim 1 wherein said strained semiconductor layer is under a compressive or tensile strain.

18. The method of claim 1 wherein said strained semiconductor layer comprises a Si-containing semiconductor.

19. The method of claim 18 wherein said Si-containing semiconductor comprises Si or SiGe.

20. The method of claim 1 wherein said strained semiconductor is a doped layer having a dopant concentration of about 1E15 atoms/cm$^3$ or greater.

21. The method of claim 1 wherein said relaxed semiconductor layer, said doped and relaxed semiconductor layer and said strained semiconductor layer have a (100), (110) or (111) crystal orientation.

22. The method of claim 1 further comprising patterning said strained semiconductor layer prior to said converting step.

23. The method of claim 1 wherein said converting step comprises an electrolytic anodization process.

24. The method of claim 23 wherein said electrolytic anodization process is performed in the presence of a HF-containing solution.

25. The method of claim 23 wherein the electrolytic anodization process is performed using a constant current source operating at a current density from about 0.05 to about 50 milliAmps/cm$^2$.

26. The method of claim 1 wherein the porous semiconductor layer has a porosity of about 0.1% or greater.

27. The method of claim 1 wherein said annealing is performed in an oxygen-containing ambient that can optionally include an inert gas.

28. The method of claim 1 wherein said annealing is performed at a temperature of greater than 400° C.

29. The method of claim 1 further comprising a baking step which reduces dopants present in said strained semiconductor-on-insulator substrate.

30. A method of fabricating a strained semiconductor-on-insulator substrate comprising:

epitaxially growing a strained semiconductor layer on a surface of an epitaxial doped and relaxed semiconductor layer, said doped and relaxed semiconductor located atop an epitaxial relaxed SiGe template;

electrolytically anodizing said doped and relaxed semiconductor layer to convert said doped and relaxed semiconductor layer into a porous layer; and oxidizing said strained semiconductor layer and said porous layer, whereby said porous layer is converted into a buried oxide layer that is located between said strained semiconductor layer and said relaxed SiGe template.

* * * * *